US012644932B2

(12) United States Patent
Salehi et al.

(10) Patent No.: US 12,644,932 B2
(45) Date of Patent: Jun. 2, 2026

(54) REFERENCE ELECTRODE-BASED BATTERY IMBALANCE DIAGNOSIS

(71) Applicant: GM GLOBAL TECHNOLOGY OPERATIONS LLC, Detroit, MI (US)

(72) Inventors: Rasoul Salehi, Ann Arbor, MI (US); Lei Wang, Rochester Hills, MI (US); Alok Warey, Novi, MI (US); Michelle H. Wiebenga, Farmington Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 412 days.

(21) Appl. No.: 18/340,270

(22) Filed: Jun. 23, 2023

(65) Prior Publication Data

US 2024/0426933 A1     Dec. 26, 2024

(51) Int. Cl.
| | |
|---|---|
| *G01R 31/392* | (2019.01) |
| *G01R 31/367* | (2019.01) |
| *G01R 31/371* | (2019.01) |
| *G01R 31/3835* | (2019.01) |
| *G01R 31/396* | (2019.01) |

(52) U.S. Cl.
CPC ......... *G01R 31/392* (2019.01); *G01R 31/367* (2019.01); *G01R 31/371* (2019.01); *G01R 31/3835* (2019.01); *G01R 31/396* (2019.01)

(58) Field of Classification Search
CPC .. G01R 31/392; G01R 31/367; G01R 31/371; G01R 31/3835; G01R 31/396; B60L 2260/44; B60L 3/0046; B60L 3/12; B60L 58/16; B60L 2240/547; B60L 2240/80; B60L 58/22; H02J 7/005; H01M 2010/4271; H01M 2010/4278; H01M 10/4207; H01M 10/425; G05B 19/0423; G05B 2219/25257
See application file for complete search history.

(56) References Cited

U.S. PATENT DOCUMENTS

| | | | |
|---|---|---|---|
| 9,451,908 B2 * | 9/2016 | Kamath | ............... A61B 5/1473 |
| 10,371,753 B1 | 8/2019 | Wang et al. | |
| 2015/0147614 A1 | 5/2015 | Wang et al. | |

FOREIGN PATENT DOCUMENTS

| | | | | |
|---|---|---|---|---|
| DE | 102020123864 A1 | 3/2022 | | |
| WO | WO 2016009175 A1 * | 1/2016 | ............ | H02J 7/0013 |

OTHER PUBLICATIONS

German Application No. 10 2023 127 039.7 filed Oct. 4, 2023; German Office Action dated Apr. 17, 2024; 9 pages.

* cited by examiner

*Primary Examiner* — Tung S Lau
(74) *Attorney, Agent, or Firm* — CANTOR COLBURN LLP

(57)     ABSTRACT
Techniques are provided for reference electrode-based battery imbalance diagnosis. In one embodiment, the techniques involve determining a state of health of a cell group, determining a state of health of a cell of the cell group, determining a cell imbalance of the cell group based on a comparison of the state of health of the cell group and the state of health of the cell, and generating an alert signal or a control signal based on the cell imbalance.

20 Claims, 5 Drawing Sheets

300

130

302

304

306

322

308

310

312

320

202<sub>1-N</sub>

330

REFERENCE ELECTRODE-BASED BATTERY IMBALANCE DIAGNOSIS

INTRODUCTION

The subject disclosure relates to battery cells, and more specifically, to detecting imbalanced degradation of individual battery cells in a battery pack.

Traditional battery packs often include individual battery cells that degrade at different rates. A battery pack can supply energy to a load despite the degradation of some of the individual cells. However, using a battery pack that includes degraded cells can reduce performance and reliability.

SUMMARY

In one exemplary embodiment, a method is provided to diagnose and mitigate battery imbalances. The method includes determining a state of health of a cell group; determining a state of health of a cell of the cell group, determining a cell imbalance of the cell group based on a comparison of the state of health of the cell group and the state of health of the cell, and generating an alert signal or a control signal based on the cell imbalance.

In addition to one or more of the features described herein, determining the state of health of the cell group includes measuring a first set of voltages across cathodes and anodes of multiple cells of the cell group, and comparing changes in the first set of voltages to changes in states of charge of the cell group.

In addition to one or more of the features described herein, determining the state of health of the cell includes discharging the cell group to a target state of charge range based on an expected cause of failure of the cell group, upon determining that an initial diagnostic condition is met, measuring, at the target state of charge range, a second set of voltages of the cell of the cell group, determining metrics of the second set of voltages, and determining the state of health of the cell based on the metrics.

In addition to one or more of the features described herein, the initial diagnostic condition includes (i) a change in a voltage of the cell group that is below a voltage threshold, or (ii) a current of the cell group that is below a current threshold value.

In addition to one or more of the features described herein, the second set of voltages includes a potential difference across the cell group, a potential difference across a reference electrode and a cathode of the cell, or a potential difference across the reference electrode and an anode of the cell.

In addition to one or more of the features described herein, the metrics include statistical variances and averages of voltages corresponding to state of health data points for various cell cycles.

In addition to one or more of the features described herein, determining the state of health of the cell involves using the metrics as indexes of a predetermined state of health table, and wherein the state of health table includes mappings between the metrics, cell cycles, and state of health values.

In another exemplary embodiment system is provided to diagnose and mitigate battery imbalances. The system includes a cell group, a processor, and memory or storage comprising an algorithm or computer instructions, which when executed by the processor, performs an operation comprising determining a state of health of the cell group, determining a state of health of a cell of the cell group, determining a cell imbalance of the cell group based on a comparison of the state of health of the cell group and the state of health of the cell, and generating an alert signal or a control signal based on the cell imbalance.

In addition to one or more of the features described herein, determining the state of health of the cell group includes measuring a first set of voltages across cathodes and anodes of multiple cells of the cell group, and comparing changes in the first set of voltages to changes in states of charge of the cell group.

In addition to one or more of the features described herein, determining the state of health of the cell includes discharging the cell group to a target state of charge range based on an expected cause of failure of the cell group, upon determining that an initial diagnostic condition is met, measuring, at the target state of charge range, a second set of voltages of the cell of the cell group, determining metrics of the second set of voltages, and determining the state of health of the cell based on the metrics.

In addition to one or more of the features described herein, the initial diagnostic condition includes (i) a change in a voltage of the cell group that is below a voltage threshold, or (ii) a current of the cell group that is below a current threshold value.

In addition to one or more of the features described herein, the second set of voltages includes a potential difference across the cell group, a potential difference across a reference electrode and a cathode of the cell, or a potential difference across the reference electrode and an anode of the cell.

In addition to one or more of the features described herein, the metrics include statistical variances and averages of voltages corresponding to state of health data points for various cell cycles.

In addition to one or more of the features described herein, determining the state of health of the cell involves using the metrics as indexes of a predetermined state of health table, and wherein the state of health table includes mappings between the metrics, cell cycles, and state of health values.

In yet another exemplary embodiment a computer-readable storage medium having a computer-readable program code embodied therewith is provided to diagnose and mitigate battery imbalances. The computer-readable program code is executable by one or more computer processors to perform an operation comprising determining a state of health of a cell group, determining a state of health of a cell of the cell group, determining a cell imbalance of the cell group based on a comparison of the state of health of the cell group and the state of health of the cell, and generating an alert signal or a control signal based on the cell imbalance.

In addition to one or more of the features described herein, determining the state of health of the cell group includes measuring a first set of voltages across cathodes and anodes of multiple cells of the cell group, and comparing changes in the first set of voltages to changes in states of charge of the cell group.

In addition to one or more of the features described herein, determining the state of health of the cell includes discharging the cell group to a target state of charge range based on an expected cause of failure of the cell group, upon determining that an initial diagnostic condition is met, measuring, at the target state of charge range, a second set of voltages of the cell of the cell group, determining metrics of the second set of voltages, and determining the state of health of the cell based on the metrics.

In addition to one or more of the features described herein, the initial diagnostic condition includes (i) a change in a voltage of the cell group that is below a voltage threshold, or (ii) a current of the cell group that is below a current threshold value.

In addition to one or more of the features described herein, the second set of voltages includes a potential difference across the cell group, a potential difference across a reference electrode and a cathode of the cell, or a potential difference across the reference electrode and an anode of the cell.

In addition to one or more of the features described herein, the metrics include statistical variances and averages of voltages corresponding to state of health data points for various cell cycles, and determining the state of health of the cell involves using the metrics as indexes of a predetermined state of health table, and wherein the state of health table includes mappings between the metrics, cell cycles, and state of health values.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
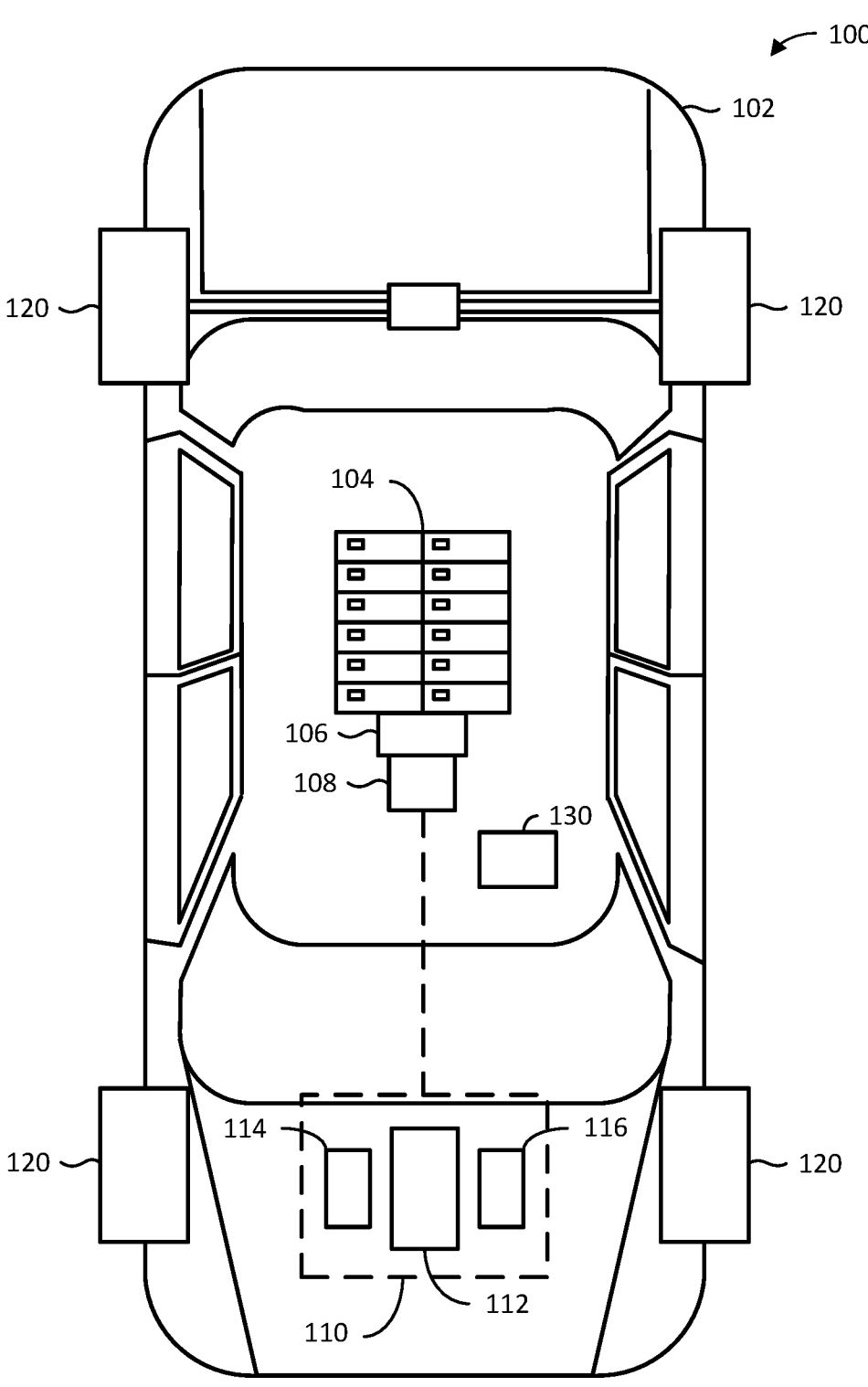
FIG. 1 illustrates a vehicle, according to one embodiment.

The following description is merely exemplary in nature and is not intended to limit the present disclosure, its application or uses. It should be understood that throughout the drawings, corresponding reference numerals indicate like or corresponding parts and features. As used herein, the term "module" refers to one or more algorithms, instruction sets, software applications, or other computer-readable program code that can be executed by a processor to perform the functions, operations, or processes described herein.

Embodiments of the present disclosure improve upon battery cell diagnosis systems by providing reference electrodes and a diagnostic module configured to diagnose battery degradation of cells (e.g., increased internal impedance due to aging) in a cell group. The diagnostic module can determine the degradation from a state of health of the cell group, and a state of health of the cells of the cell group. In one embodiment, the diagnostic module determines the state of health of a cell via a reference electrode inserted into the cell.

One benefit of the disclosed embodiments is to reduce safety risks by diagnosing the degradation of individual cells of the cell group, and generating an alert or control signal that can be used to mitigate use of the degraded cell.

FIG. 1 illustrates a vehicle 100, according to one embodiment. The vehicle 100 includes a body 102, which can support a power system 104, propulsion system 110, a controller 130, and other systems of the vehicle 100 described herein.

In one embodiment, the vehicle 100 is an electric vehicle (EV), or a hybrid electric vehicle (HEV). In the illustrated embodiment, the vehicle 100 is an HEV that is partially powered by the power system 104, which includes multiple interconnect battery cells. The power system 104 can be electrically coupled to at least one electric motor assembly of the propulsion system 110. In one embodiment, the power system 104 is electrically coupled to a direct current (DC) converter module 106 (e.g., a DC-DC converter) and an inverter module 108 (e.g., a traction power inversion unit). The inverter module 108 can include multiple inverters that convert DC signals from the power system 104 to three-phase alternating current (AC) signals to drive electric motors of the propulsion system 110. The power system 104 can also be electrically coupled to vehicle electronics systems such as audio systems, display systems, navigation systems, temperature control systems, or the like.

The propulsion system 110 can include an internal combustion engine (ICE) system 112 and at least one electric motor assembly (e.g., a first electric motor 114 and a second electric motor 116). Each component of the propulsion system 110 can be configured to drive at least one the wheels 120 of the vehicle 100 via a transmission system coupled to a front axle shaft or a rear axle shaft, which are coupled to a respective front and rear set of the wheels 120.

In one embodiment, the controller 130 is configured to diagnose the power system 104 and control the propulsion system 110, or other systems of the vehicle 100. The controller 130 is discussed in greater detail in FIGS. 2 and 3. Techniques used to diagnose the power system 104 are discussed in FIGS. 4 and 5.

Figure 2:
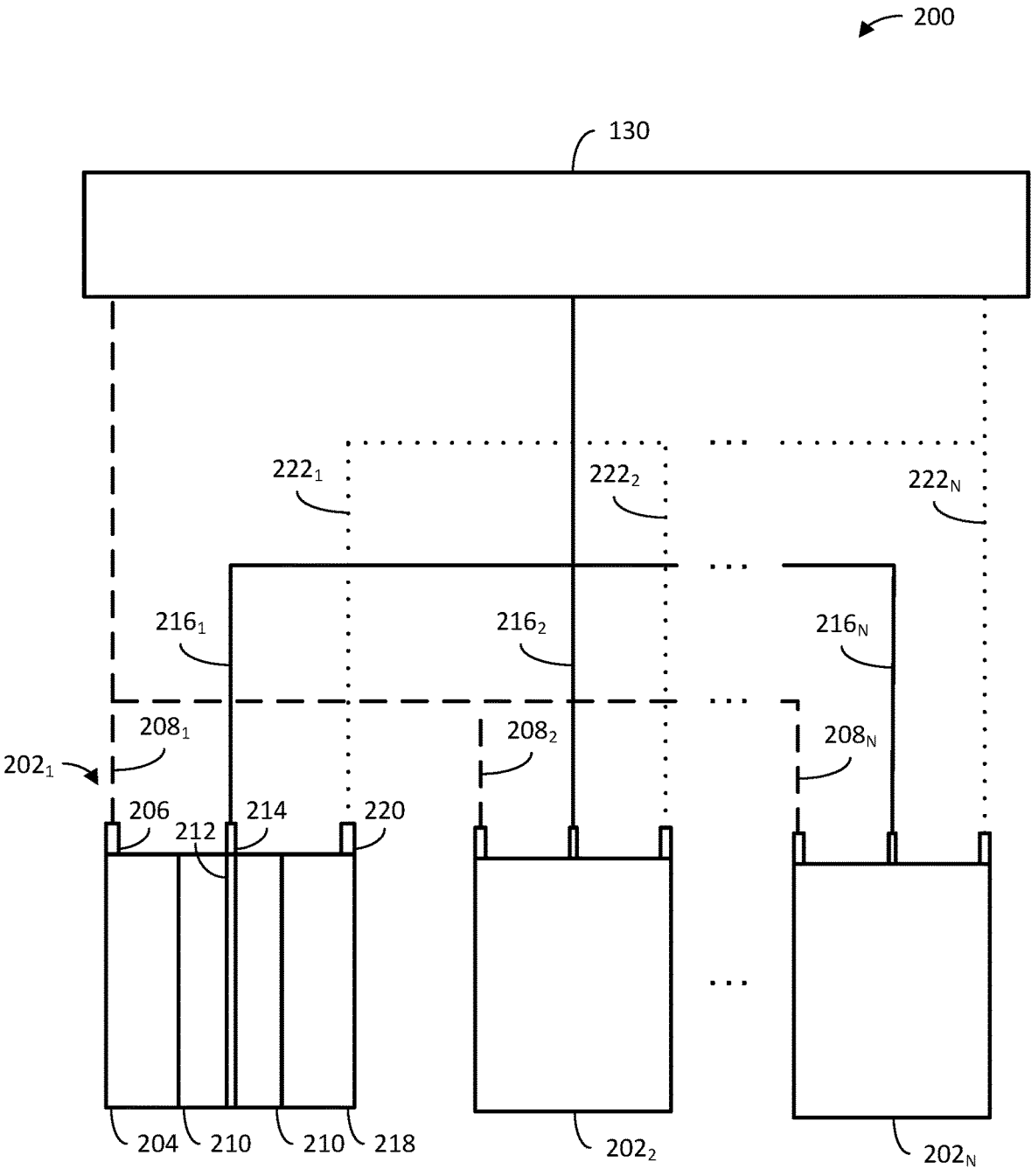
FIG. 2 illustrates a cell group diagnosis environment, according to one embodiment.

FIG. 2 illustrates cell group diagnosis environment 200, according to one embodiment. In the illustrated embodiment, the cell group diagnosis environment 200 includes a cell group (cells $202_{1-N}$), anode connections $208_{1-N}$, reference electrode connections $216_{1-N}$, cathode connections $222_{1-N}$, and a controller 130. In one embodiment, the cells $202_{1-N}$ are lithium-ion cells.

As shown in FIG. 2, a cell $202_1$ can include an anode 204, an anode tab 206, a separator 210, current collectors (not shown), a reference electrode 212, a reference electrode tab 214, a cathode 218, and a cathode tab 220. Each of the cells $202_{1-N}$ can include comparable components and operations.

In one embodiment, the anode 204 is a lower potential terminal of the cell $202_1$ that includes carbon graphite layers that store lithium atoms, and the cathode 218 is a higher potential terminal of the cell $202_1$ that includes a lithium metal oxide.

When there is an available path for electrons to move to the cathode 218, a potential difference between the anode 204 and the cathode 218 causes electrons to separate from the lithium atoms of the anode 204, and follow the available path to the cathode 218. For example, the electrons may move from the anode 204 to the controller 130 (via a first current collector, the anode tab 206, and an anode connection $208_1$), and then move from the controller 130 to the cathode 218 (via a cathode connection $222_1$, the cathode tab 220, and a second current collector).

The separator 210 can include a non-conductive, semi-permeable insulator, and electrolyte material or solution, which allows the passage of lithium ions, while blocking the passage of electrons. In one embodiment, solvent molecules in the electrolyte combine with lithium ions that pass through the separator 210, and form a solid electrolyte interface (SEI) at the anode 204. The SEI can prevent direct contact between the electrolyte and the electrons, thereby preventing the electrons from degrading the electrolyte. In this manner, the separator 210 allows the lithium ions to move between the anode 204 and the cathode 218 to neutralize a buildup of electrons at the cathode 218.

In the illustrated embodiment, each of the cells $202_{1-N}$ includes a reference electrode, however techniques are provided herein to diagnose cell degradation when at least one cell of the cell group includes a reference electrode. In one embodiment, the reference electrode 212 is a conductive material (e.g., a lithium-based material) inserted into the cell $202_1$ at the separator 210. The reference electrode 212 may or may not be in contact with components of the separator 210, and does not interfere with the functions or operations of the separator 210. Further, the potential of the reference electrode 212 is independent of changes to potential of the anode 204 and the cathode 218. For instance, when the cell $202_1$ is charged, potential of the anode 204 and the cathode 218 can change, while the potential of the reference electrode 212 remains unchanged.

The controller 130 can be configured to measure voltages of the cell $202_1$ via the anode tab 206, the reference electrode tab 214, and the cathode tab 220. As used herein, a potential difference between the anode 204 and the cathode 218 of the cell $202_1$ may be referenced as $V_{Cell1}$. Corresponding potential differences of cells $202_{2-N}$ may be referenced as $V_{Cell2}$ through $V_{CellN}$, respectively. Collectively, a potential difference of the cell group (i.e., Cells $202_{1-N}$) may be referenced as $V_{CG}$.

A potential difference between the reference electrode 212 and the anode 204 may be referenced as $V_{RA1}$. A potential difference between the cathode 218 and reference electrode 212 may be referenced as $V_{RC1}$. The term "reference electrode voltage" or $V_{R1}$ may be used to reference either $V_{RA1}$ or $V_{RC1}$. Corresponding reference electrode voltages of cells $202_{2-N}$ may be referenced as $V_{R2}$ through $V_{RN}$, respectively.

In one embodiment, the controller 130 diagnoses an imbalanced degradation of the cells $202_{1-N}$ of the cell group. The controller 130 is described further in FIG. 3.

The controller 130 can perform the diagnosis based on states of health determined from $V_{CG}$ and $V_{R1-RN}$. Techniques for determining the states of health of cells that include a reference electrode are described further in FIG. 4 below.

Techniques for identifying imbalances in the cells $202_{1-N}$ can depend on the number of reference electrodes included in the cell group. Techniques for identifying the imbalances are described further in FIG. 5.

Figure 3:
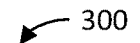
FIG. 3 illustrates a computing environment, according to one embodiment.

FIG. 3 illustrates a computing environment 300, according to one embodiment. In the illustrated embodiment, the computing environment 300 includes a controller 130, network 330, and cells $202_{1-N}$.

In one embodiment, the controller 130 includes a processor 302 that obtains instructions and data via a bus 322 from a memory 304 or storage 308. Not all components of the controller 130 are shown. The controller 130 is generally under the control of an operating system (OS) suitable to perform or support the functions or processes disclosed herein. The processor 302 is a programmable logic device that performs instruction, logic, and mathematical processing, and may be representative of one or more CPUs. The processor may execute one or more algorithms, instruction sets, or applications in the memory 304 or storage 308 to perform the functions or processes described herein.

The memory 304 and storage 308 can be representative of hard-disk drives, solid state drives, flash memory devices, optical media, and the like. The storage 308 can also include structured storage (e.g., a database). In addition, the memory 304 and storage 308 may be considered to include memory physically located elsewhere. For example, the memory 304 and storage 308 may be physically located on another computer communicatively coupled to the controller 130 via the bus 322 or the network 330.

The controller 130 can be connected to other computers (e.g., controllers, distributed databases, servers, or webhosts) or the cells $202_{1-N}$ via a network interface 320 and the network 330. The network 330 can comprise, for example, any combination of busses, physical transmission cables, optical transmission fibers, or wireless transmission. In one embodiment, the network 330 includes routers, firewalls, switches, gateway computers, edge servers, a local area network, a wide area network, or a wireless network. The network can also include a vehicle controller area network (CAN) or transmission control protocol (TCP) bus. The network interface 320 may be any type of network communications device allowing the controller 130 to communicate with computers and other components of the computing environment 300 via the network 330.

In the illustrated embodiment, the memory 304 includes a diagnostic module 306. In one embodiment, the diagnostic module 306 represents one or more algorithms, instruction sets, software applications, or other computer-readable program code that can be executed by the processor 302 to perform the functions, operations, or processes described herein.

In one embodiment, the diagnostic module 306 measures voltages of the cells (e.g., $V_{Cell1-N}$ and $V_{R1-N}$), and stores the voltages in the storage 308 as cell data 312. The diagnostic module 306 can also determine metrics from the voltages, and use the metrics to estimate states of health. The metrics can be stored as cell data 312. The states of health can be stored in the storage 308 as state of health data 310. The diagnostic module 306 can then use the state of health data 310 to determine cell imbalances in the cell group. Operation of the diagnostic module 306 is described in further detail in FIGS. 4-5 herein.

Figure 4:
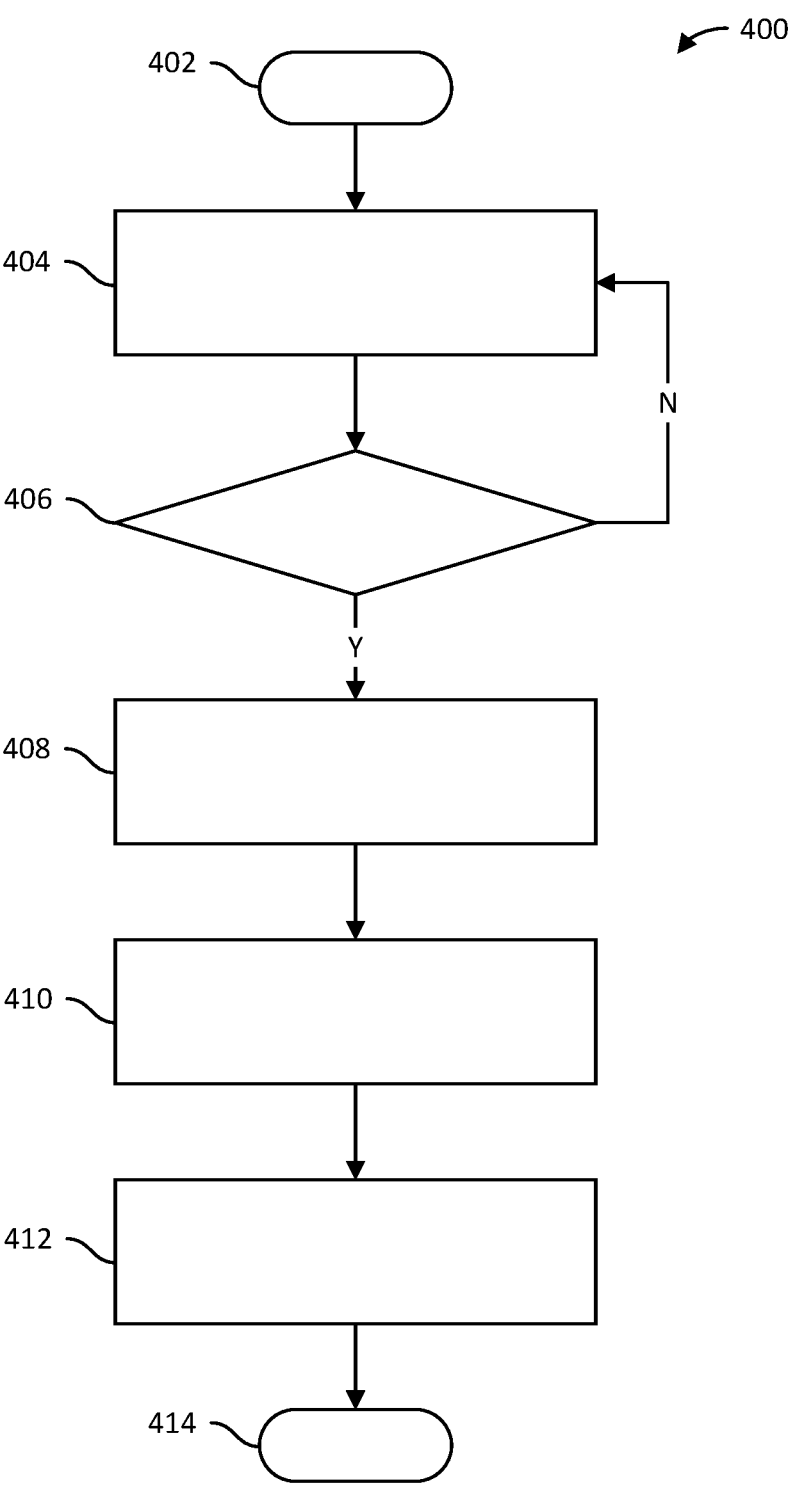
FIG. 4 illustrates a flowchart of a method of determining a state of health of a cell that includes a reference electrode, according to one embodiment.

FIG. 4 illustrates a flowchart of a method 400 of determining a state of health of a cell that includes a reference electrode, according to one embodiment. The method 400 begins at block 402.

At block 404, the diagnostic module 306 discharges a cell group to a target state of charge (SOC) range. The target SOC range can be determined based on expected causes of failure that increase an impedance of the cell group. Examples of the causes of failure may include cell plating degradation, electrolyte degradation, solid electrolyte interface (SEI) growth, separator degradation, or the like.

Each cause of failure may have a different detectability at different target SOC ranges. Further, potential at the anode 204, the reference electrode 212, and the cathode 218 may each have different sensitivities to different causes of failure. Therefore, the target SOC range may be selected based on an expected cause of failure, and the cell group can be discharged to the target SOC range to provide clear distinctions between potential measured at the anode 204, the reference electrode 212, or the cathode 218 at different cycle counts. The potential at the anode 204, the reference electrode 212, or the cathode 218 may be indicative of the impedance of the cell group.

For example, as discussed above, solvent molecules in an electrolyte can combine with lithium ions, and form an SEI growth at the anode 204. SEI growth at the anode 204 can be an indicator of cell degradation. In one embodiment, the SEI can change a composition of the anode 204 such that a potential of the anode 204 at different cycles deviates at a low SOC range (e.g., 0.4 V-0.6V) within a target voltage range (e.g., 2.5 V-3 V). Hence, the method 400 can measure voltages at the target SOC range to improve diagnosis of degradation of cells $202_{1-N}$ of the cell group.

At block 406, the diagnostic module 306 determines whether an initial diagnostic condition is met. In one embodiment, the diagnostic condition includes at least one of: (i) a change in the voltage of the cell group that is below a voltage threshold, or (ii) a current of the cell group that is below a current threshold value. The voltage threshold can represent a voltage value that ensures a stable voltage of the cell group (e.g., the voltage threshold may be on the order of 0.1 V or less). The current threshold can represent a current value that ensures a small current or lack of current through the cell group (e.g., the threshold may be on the order of 0.1 A or less).

Upon determining that the initial diagnostic condition is not met, the method 400 proceeds to block 404, where it performs as described above. However, upon determining that the initial diagnostic condition is met, the method 400 proceeds to block 408.

At block 408, the diagnostic module 306 measures, at the target SOC range, a set of voltages of each cell of the cell group. In one embodiment, the set of voltages include potential differences across each cell of the cell group (e.g., $V_{Cell1-N}$, collectively $V_{CG}$), and potential differences across a reference electrode and an anode or cathode of the respective cells (e.g., $V_{RA1-N}$ or $V_{RC1-N}$, collectively $V_{R1-N}$).

At block 410, the diagnostic module 306 determines metrics for the set of voltages. In one embodiment, the metrics include statistical variances and averages of the set of voltages. For instance, the metrics may include a variances and averages of $V_{Cell1-N}$ or $V_{R1-N}$ across multiple measurements of the cells $202_{1-N}$.

At block 412, the diagnostic module 306 determines a state of health (SOH) based on the metrics. In one embodiment, the SOH of a battery cell represents a remaining useful life of the cell (e.g., an internal impedance value, a number of expected remaining life cycles, a percentage of remaining charge, or the like) as ratio of a present condition of the cell to ideal conditions of the cell.

The diagnostic module 306 can determine the SOH of each cell of the cell group by using the metrics as indexes of a predetermined SOH table that maps the metrics to SOHs of each of the cells $202_{1-N}$ at progressive life cycles of the cells $202_{1-N}$. The SOH table may be created via a calibration process that records data from cell cycle iterations during a design or development process of the cells $202_{1-N}$. The SOH table can be stored in the storage 308 as state of health data 310. In this manner, SOHs of the cells $202_{1-N}$ can be determined for diagnosing an imbalance in the cell group via processes similar to the process described in FIG. 5. The method 400 ends at block 414.

Figure 5:
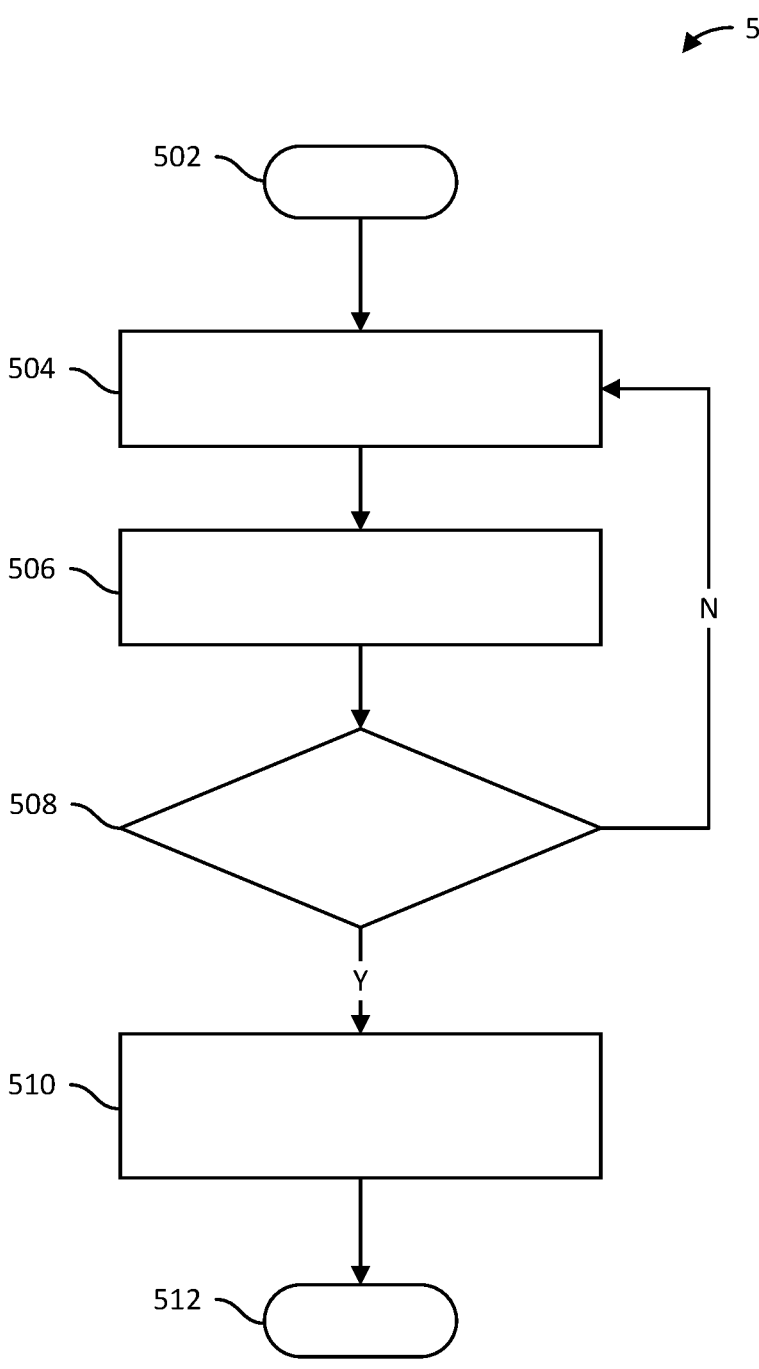
FIG. 5 illustrates a flowchart of a method of diagnosing an imbalance in a cell group, according to one embodiment.

FIG. 5 illustrates a flowchart of a method 500 of diagnosing an imbalance in a cell group, according to one embodiment. The method 500 begins at block 502.

At block 504, the diagnostic module 306 determines a state of health of a cell group. As used herein, the SOH of the cell group may be referenced as $SOH_{CG}$.

In one embodiment, the diagnostic module 306 determines an $SOH_{CG}$ by measuring $V_{Cell1-N}$ across of the cathodes and anodes of the cells $202_{1-N}$, and comparing changes in $V_{cell1-N}$ to changes in SOCs of the cell group. This process may be performed when at least one of the cells $202_{1-N}$ includes a reference electrode. In another embodiment, when all of the cells $202_{1-N}$ include reference electrodes, the diagnostic module 306 determines an $SOH_{CG}$ using a process similar to the process discussed in FIG. 4, which determines an SOH of each of the cells $202_{1-N}$ (collectively representing an $SOH_{CG}$.

At block 506, the diagnostic module 306 determines a state of health of a cell of the cell group. In a first non-limiting example, when the cell group includes only one reference electrode (e.g., when cell $202_1$ includes a reference electrode and cells $202_{2-N}$ do not include reference electrodes), the diagnostic module 306 determines the SOH of the cell with the reference electrode ($SOH_{C1}$ for cell $202_1$) using a process similar to the process discussed in FIG. 4.

In a second non-limiting example, when at least two of the cells (e.g., cells $202_{1-2}$) include reference electrodes, and at least one cell (e.g., cell $202_N$) does not include a reference electrode, the diagnostic module 306 determines the SOHs of cells with the reference electrodes ($SOH_{C1}$ and $SOH_{C2}$ for cell $202_1$ and cell $202_2$, respectively) using a process similar to the process discussed in FIG. 4. The diagnostic module 306 can then determine SOHs of cells without reference electrodes (e.g., $SOH_{C3-CN}$ for cells $202_{3-N}$) by multiplying the $SOH_{CG}$ by the number of cells of the cell group, subtracting the SOHs of cells with reference electrodes, and dividing the remainder by the number of cells without reference electrodes. The resultant SOH represents the SOH for the cells without reference electrodes.

For example, when there are three cells in the cell group (e.g., Cells $202_{1-2}$ that include reference electrodes, and Cell $202_N$ that does not include a reference electrode), $SOH_{CN}$ can be determined as follows: $SOH_{CN}=(3*SOH_{CG}-SOH_{C1}-SOH_{C2})/1$. In another example, when there are 5 cells in the cell group (e.g., Cells $202_{1-3}$ that include reference electrodes, and Cell $202_{4-N}$ that do not include reference electrodes), $SOH_{C4}$ and $SOH_{CN}$ may be determined as follows: $SOH_{CN}=SOH_{CN}=(5*SOH_{CG}-SOH_{C1}-SOH_{C2}-SOH_{C3})/2$.

In a third non-limiting example, when all of the cells $202_{1-N}$ include reference electrodes, the diagnostic module 306 determines the SOHs of the cells ($SOH_{C1-CN}$ for cells $202_{1-N}$) using a process similar to the process discussed in FIG. 4.

At block 508, the diagnostic module 306 determines whether a cell imbalance in the cell group exists. In one embodiment, a cell imbalance represents a degradation of a cell of the cell group (e.g., degraded components due to aging, extreme temperatures, fast charging, thermal cycling, or the like).

Continuing the first example of block 506 (when the cell group includes only one reference electrode), the diagnostic module 306 determines that a cell imbalance of the cell group exists when an SOH of the cell group ($SOH_{CG}$) is not equal to an SOH of the cell with the reference electrode ($SOH_{C1}$). An imbalance threshold ($T_1$) can be added as a buffer to negate the impact of slight variations in SOHs from affecting the diagnosis. Put differently, the SOH of the cell with the reference electrode ($SOH_{C1}$) is expected to reflect the SOH of the cell group ($SOH_{CG}$). That is, $SOH_{C1}$ and $SOH_{CG}$ are expected to have similar remaining useful lives. Hence, when $SOH_{CG}-SOH_{C1}>T_1$, there is a disparity in the remaining useful lives of the cell group and the individual cell. Thus, the diagnostic module 306 can determine that there is an imbalance of at least one of the cells of the cell group. However, when $SOH_{CG}-SOH_{C1}<T_1$, the diagnostic module 306 determines that there is no imbalance in the cell group.

In this example, the diagnostic module 306 can identify when the cell with the reference electrode (e.g., cell $202_1$)

includes the cell imbalance. However, when the cell imbalance is found in the other cells (e.g., cell $202_{2-N}$), the diagnostic module 306 may identify that the cell imbalance exists in the cell group, without determining which cell includes the imbalance.

Continuing the second example of block 506 (when at least two, but not all, cells of the cell group include reference electrodes), the diagnostic module 306 determines that a cell imbalance of the cell group exists when the SOH of the cell group ($SOH_{CG}$) exceeds an SOH of any individual cell of the cell group ($SOH_{C1-CN}$). The imbalance threshold ($T_1$) can be added as a buffer to negate the impact of slight variations in SOHs from affecting the diagnosis. Put differently, the SOHs of each of the cells ($SOH_{C1-CN}$) are expected to reflect the SOH of the cell group ($SOH_{CG}$). As previously discussed, an SOH represents a remaining useful life of a cell. Thus, when $SOH_{CG}$–any of $SOH_{C1-CN}>T_I$, the respective cell has a lower remaining useful life than expected given $SOH_{CG}$. Hence, in this circumstance, the diagnostic module 306 can determine that there is an imbalance of the cell group due to the respective cell. However, when $SOH_{CG}$–any of $SOH_{C1-CN}<T_I$, the diagnostic module 306 can determine that there is no imbalance in the cell group.

The processes described in the second example can also be used to diagnose cell imbalances when all of the cells include reference electrodes, as per the third example.

Upon determining that a cell imbalance does not exist, the method 500 proceeds to block 504, where it determines $SOH_{CG}$ as discussed above. However, upon determining that a cell imbalance does exist, the method 500 proceeds to block 510.

At block 510, the diagnostic module 306 generates an alert signal or a control signal based on the cell imbalance.

In one embodiment, the diagnostic module 306 transmits the alert signal to a user of the cell group. For example, if the cell group is used in a vehicle, the diagnostic module 306 may send the alert signal to a display of the vehicle. The display can then show a warning of the cell imbalance diagnosis, and of potential dangers associated with the cell imbalance, to the user.

In one embodiment, the diagnostic module 306 transmits the control signal to another controller that controls a use of the cell group. For example, if the cell group is used in a device, the diagnostic module 306 may send the control signal to a controller that can power down the device to prevent further use of the cell group. In another example, the diagnostic module 306 may transmit the control signal to a battery management system that disconnects the individual cells that include the imbalance, such that the cell group may be used without contribution from the cells that include the imbalances. The method ends at block 512.

The terms "a" and "an" do not denote a limitation of quantity, but rather denote the presence of at least one of the referenced items. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method comprising:
   determining a state of health of a cell group ($SOH_{CG}$), the cell group including a plurality of cells and the plurality of cells including a first set of cells and a second set of cells, wherein each cell in the first set of cells includes a reference electrode and each cell in the second set of cells lacks the reference electrode;
   determining a state of health of a cell of the cell group in the second set of cells by multiplying the $SOH_{CG}$ by the number of cells of the cell group, subtracting the state of health of cells with reference electrodes, and dividing a remainder by a number of cells in the second set of cells;
   determining a cell imbalance of the cell group based on a comparison of the state of health of the cell group and the state of health of the cell, wherein the cell imbalance of the cell group is a condition where the state of health of the cell group is not equal to the state of health of the cell of the cell group; and
   generating an alert signal or a control signal based on the cell imbalance;
   transmitting the alert to a controller configured to control the cell group, wherein the alert causes the controller to perform one of powering down a device including the cell group and disconnecting individual cells of the cell group such that the cell group may be used without contribution from a cell including the imbalance.

2. The method of claim 1, wherein determining the state of health of the cell group includes:
   measuring a first set of voltages across cathodes and anodes of multiple cells of the cell group; and
   comparing changes in the first set of voltages to changes in states of charge of the cell group.

3. The method of claim 1, wherein determining the state of health of the cell includes:
   discharging the cell group to a target state of charge range based on an expected cause of failure of the cell group;
   upon determining that a first diagnostic condition is met, measuring, at the target state of charge range, a second set of voltages of the cell of the cell group;
   determining metrics of the second set of voltages; and
   determining the state of health of the cell based on the metrics.

4. The method of claim 3, wherein the initial a first diagnostic condition includes: (i) a change in a voltage of the cell group that is below a voltage threshold, or (ii) a current of the cell group that is below a current threshold value.

5. The method of claim 3, wherein the second set of voltages includes a potential difference across the cell group, a potential difference across a reference electrode and a cathode of the cell, or a potential difference across the reference electrode and an anode of the cell.

6. The method of claim 3, wherein the metrics include statistical variances and averages of voltages corresponding to state of health data points for various cell cycles.

7. The method of claim 3, wherein determining the state of health of the cell involves using the metrics as indexes of a predetermined state of health table, and wherein the state of health table includes mappings between the metrics, cell cycles, and state of health values.

8. A vehicle power control system, comprising:

a cell group ($SOH_{CG}$), the cell group including a plurality of cells and the plurality of cells including a first set of cells and a second set of cells, wherein each cell in the first set of cells includes a reference electrode and each cell in the second set of cells lacks the reference electrode;

a processor; and memory or storage comprising an algorithm or computer instructions, which when executed by the processor, performs an operation comprising:

determining a state of health of the cell group;

determining a state of health of a cell in the second set of cells by multiplying the $SOH_{CG}$ by the number of cells of the cell group, subtracting the state of health of cells with reference electrodes, and dividing a remainder by a number of cells in the second set of cells;

determining a cell imbalance of the cell group based on a comparison of the state of health of the cell group and the state of health of the cell, wherein the cell imbalance of the cell group is a condition where the state of health of the cell group is not equal to the state of health of the cell of the cell group;

generating an alert signal or a control signal based on the cell imbalance;

transmitting the alert to a controller configured to control the cell group, wherein the alert causes the controller to perform one of powering down a device including the cell group and disconnecting individual cells of the cell group such that the cell group may be used without contribution from a cell including the imbalance.

9. The vehicle power control system of claim 8, wherein determining the state of health of the cell group includes:

measuring a first set of voltages across cathodes and anodes of multiple cells of the cell group; and comparing changes in the first set of voltages to changes in states of charge of the cell group.

10. The vehicle power control system of claim 8, wherein determining the state of health of the cell includes:

discharging the cell group to a target state of charge range based on an expected cause of failure of the cell group;

upon determining that a first diagnostic condition is met, measuring, at the target state of charge range, a second set of voltages of the cell of the cell group, wherein the cell imbalance of the cell group is a condition where the state of health of the cell group is not equal to the state of health of the cell of the cell group;

determining metrics of the second set of voltages;

determining the state of health of the cell based on the metrics; and transmitting the alert to a controller configured to control the cell group, wherein the alert causes the controller to perform one of powering down a device including the cell group and disconnecting individual cells of the cell group such that the cell group may be used without contribution from a cell including the imbalance.

11. The vehicle power control system of claim 10, wherein the first diagnostic condition includes: (i) a change in a voltage of the cell group that is below a voltage threshold, or (ii) a current of the cell group that is below a current threshold value.

12. The vehicle power control system of claim 10, wherein the second set of voltages includes a potential difference across the cell group, a potential difference across a reference electrode and a cathode of the cell, or a potential difference across the reference electrode and an anode of the cell.

13. The vehicle power control system of claim 10, wherein the metrics include statistical variances and averages of voltages corresponding to state of health data points for various cell cycles.

14. The vehicle power control system of claim 10, wherein determining the state of health of the cell involves using the metrics as indexes of a predetermined state of health table, and wherein the state of health table includes mappings between the metrics, cell cycles, and state of health values.

15. A non-transitory computer-readable storage medium having a non-transitory computer-readable program code embodied therewith, the computer-readable program code executable by one or more computer processors to perform an operation comprising:

determining a state of health of a cell group ($SOH_{CG}$), the cell group including a plurality of cells and the plurality of cells including a first set of cells and a second set of cells, wherein each cell in the first set of cells includes a reference electrode and each cell in the second set of cells lacks the reference electrode;

determining a state of health of a cell of the cell in the second set of cells by multiplying the $SOH_{CG}$ by the number of cells of the cell group, subtracting the state of health of cells with reference electrodes, and dividing a remainder by a number of cells in the second set of cells;

determining a cell imbalance of the cell group based on a comparison of the state of health of the cell group and the state of health of the cell; and generating an alert signal or a control signal based on the cell imbalance.

16. The computer-readable storage medium of claim 15, wherein determining the state of health of the cell group includes:

measuring a first set of voltages across cathodes and anodes of multiple cells of the cell group; and comparing changes in the first set of voltages to changes in states of charge of the cell group.

17. The computer-readable storage medium of claim 15, wherein determining the state of health of the cell includes:

discharging the cell group to a target state of charge range based on an expected cause of failure of the cell group;

upon determining that a first diagnostic condition is met, measuring, at the target state of charge range, a second set of voltages of the cell of the cell group;

determining metrics of the second set of voltages; and determining the state of health of the cell based on the metrics.

18. The computer-readable storage medium of claim 17, wherein the first diagnostic condition includes: (i) a change in a voltage of the cell group that is below a voltage threshold, or (ii) a current of the cell group that is below a current threshold value.

19. The computer-readable storage medium of claim 17, wherein the second set of voltages includes a potential difference across the cell group, a potential difference across a reference electrode and a cathode of the cell, or a potential difference across the reference electrode and an anode of the cell.

20. The computer-readable storage medium of claim 17, wherein the metrics include statistical variances and averages of voltages corresponding to state of health data points for various cell cycles, wherein determining the state of health of the cell involves using the metrics as indexes of a predetermined state of health table, and wherein the state of health table includes mappings between the metrics, cell cycles, and state of health values.

\* \* \* \* \*